(12) United States Patent
Hudson et al.

(10) Patent No.: US 7,327,011 B2
(45) Date of Patent: Feb. 5, 2008

(54) MULTI-SURFACED PLATE-TO-PLATE CAPACITOR AND METHOD OF FORMING SAME

(75) Inventors: Jason D. Hudson, Eaton, CO (US); Sean Erickson, Fort Collins, CO (US); Michael J. Saunders, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 69 days.

(21) Appl. No.: 11/266,133

(22) Filed: Nov. 2, 2005

(65) Prior Publication Data

US 2007/0096252 A1 May 3, 2007

(51) Int. Cl.
*H01L 29/00* (2006.01)

(52) U.S. Cl. .............................. 257/534; 257/E27.048; 257/E21.019; 438/396

(58) Field of Classification Search ................ 438/393, 438/396; 257/534, E27.048, E21.011, E21.019
See application file for complete search history.

(56) References Cited

U.S. PATENT DOCUMENTS

| | | | |
|---|---|---|---|
| 5,753,963 A | 5/1998 | Cronin | 257/532 |
| 6,225,728 B1* | 5/2001 | Gururaja | 310/334 |
| 6,743,671 B2* | 6/2004 | Hu et al. | 438/253 |
| 6,894,364 B2 | 5/2005 | Hao et al. | 257/532 |
| 6,919,233 B2 | 7/2005 | Papa Rao et al. | 438/128 |
| 6,998,216 B2* | 2/2006 | He et al. | 430/296 |
| 2005/0064658 A1 | 3/2005 | Biery et al. | 438/239 |
| 2005/0139885 A1* | 6/2005 | Liu | 257/296 |
| 2006/0103031 A1* | 5/2006 | Wu | 257/781 |

* cited by examiner

*Primary Examiner*—Trung Dang
(74) *Attorney, Agent, or Firm*—Ortiz & Lopez, PLLC

(57) ABSTRACT

A plate to plate capacitor has a first plate, a second plate, and an insulating medium separating the first plate from the second plate. The first plate and the second plate are adapted and arranged to form an interlaced structure in which multiple capacitance surface areas in different planes, such as horizontal and vertical, are provided between said first and second plates. The plate to plate capacitor can be formed as a stack of layers in which one or more alternating first and third insulating layers each have first and second conductive lines configured therein and in which one or more second insulating layers having conductive vias formed therein interpose respective first and third insulating layers. The first and second conductive lines in the first insulating layer(s) are interconnected by the conductive vias to the first and second conductive lines, respectively, in the third layer(s) so as to interlace the first and second metal conductive lines together.

18 Claims, 6 Drawing Sheets

MULTI-SURFACED PLATE-TO-PLATE CAPACITOR AND METHOD OF FORMING SAME

TECHNICAL FIELD

Embodiments are generally related to capacitors and, more particularly, to multi-surfaced plate to plate capacitors and methods of manufacturing such capacitors. Additionally, embodiments are related to discrete multi-surfaced capacitors and methods of fabricating such capacitors as thin-film structures.

BACKGROUND

Capacitors are utilized in a whole range of electronic circuits, both digital and analog, for the purpose of storing electricity or electrical energy. Capacitors also function as a filter, passing alternating current (AC), and blocking direct current (DC).

An ever increasing trend of downscaling of electronic components has led to a demand for discrete capacitors which have smaller dimensions but the same large capacitance values and which can be manufactured using thin file fabrication techniques suitable for integrating such capacitors into micro electronic devices, such as semiconductor chip devices, or other devices used in micro or nano technologies.

A variety of types of capacitors and methods of fabrication have been employed to date. One such capacitor is a Metal-Insulator-Metal (MIM) capacitor, typically used in CMOS, RF and other applications, which consists of a planar structure having a thin dielectric layer sandwiched between two metallic electrodes or plates. MIM capacitors are usually fabricated as a stack of layers in semiconductor device wafers by sequentially forming a patterned metal layer, an insulator layer thereon and another patterned metal layer on the insulator layer. Fabrication of the MIM insulator and top layer metal require separate lithographic mask sets, as well as additional steps through processing making the wafers containing MIM capacitors costly to produce. Furthermore, a significant amount of spacing between other metal layers is required resulting in a larger proportion of valuable chip area being required to accommodate the MIM capacitors.

Connection points for MIM and other existing capacitors are on two different sides of the device which can lead to difficulty when connecting them to other circuitry, especially if the circuitry has a very dense layout where surface area is scarce.

There is a continuing need to provide capacitors utilized in integrated circuit or discrete circuit applications which can be manufactured and integrated into circuits more efficiently.

The embodiments disclosed herein therefore directly address the shortcomings of present capacitors providing a plate to plate capacitor that can be integrated more effectively into integrated circuit applications or other discrete circuit applications.

BRIEF SUMMARY

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide for an improved plate to plate capacitor.

It is another aspect of the present invention to provide for a thin-film plate to plate capacitor which can be easily integrated into existing integrated circuits.

It is a further aspect of the present invention to provide for plate to plate capacitor which can be manufactured to provide increased capacitance densities without having to increase the amount of substrate surface area needed to accommodate the capacitor.

It is an additional aspect of the present invention to provide for a method of manufacturing such aforementioned plate to plate capacitors.

The aforementioned aspects of the invention and other objectives and advantages can now be achieved as described herein.

According to one aspect, a plate to plate capacitor has a first plate, a second plate, and an insulating medium separating the first plate from the second plate. The first and second plates are adapted and arranged so as to form an interlaced structure in which multiple capacitance surface areas are provided between the first and second plates. The multiple capacitance surface areas can be provided between portions of the first and second plates in the same and different planes. Advantageously, the capacitor therefore contains many small plate to plate capacitance surface areas that, together, form a large total known capacitance.

Since the capacitor has an interlaced structure, the capacitor has the advantage of having multiple contact points to both plates on any one side of the capacitor, or alternatively, on or in different locations of the interlaced structure which enables bus connections to be customized to suit other circuitry requirements more easily than existing capacitors with fixed hook up points thereby facilitating easier routing between the capacitor and other circuits. Furthermore, since the bus connections can optionally be made to both plates at the same side or at the same area within or above the capacitor, the substrate area required for making the bus connections can be reduced compared to existing capacitors which require additional substrate area for running bus connections to electrodes on different sides of the capacitors. For these reasons, the capacitor can therefore be integrated into existing integrated circuits more easily and effectively than existing capacitors.

The capacitor can be implemented in the form of a thin film capacitor so that the capacitor can be employed in existing integrated circuits.

The first plate of the capacitor can be formed as a plurality of interconnected first conductive lines and the second plate can be formed as a plurality of interconnected second conductive lines. The first and second conductive lines can be interlaced together.

The first and second conductive lines can be configured next to one another in one or more first and second separate planes. The first and second conductive lines configured in the first plane(s) can be interconnected by conductive links to the first and second conductive lines, respectively, in the second plane(s). The first and second conductive lines configured in the first plane(s) can be arranged relative to corresponding first and second conductive lines in the second plane(s) such that portions of the first and said second conductive lines in the first plane(s) overlap portions of second and first conductive lines, respectively, in the second plane(s). The first and second planes can be substantially parallel. Capacitance surface areas can be provided between substantially parallel portions of adjacent first and second conductive lines in each of the first and third layers and between substantially parallel overlapping portions of said first and second conductive lines.

According to another aspect, a plate to plate capacitor has a plurality of first and second conductive lines formed spaced apart in a stack of insulating layers. The first and second conductive lines of adjacent insulating layers are respectively interconnected so as to form first and second capacitor plates, respectively. The first and second conductive lines are interlaced to provide multiple capacitance surface areas between the first and second plates.

Advantageously, the capacitance density of the capacitor can be increased or decreased, by increasing or decreasing the number of layers employed in the capacitor, without changing the substrate surface area needed to accommodate the capacitor. The more stacked layers present, the higher the total capacitance per area of chip surface. The capacitor can therefore be integrated more easily into existing integrated circuits because the capacitance density of the capacitor can be increased without requiring more substrate surface area to accommodate the capacitor The first and second conductive lines can be formed spaced apart in one or more first insulating layers and one or more third insulating layers. A plurality of conductive vias can be formed spaced apart in one or more second insulating layer(s). The second layer(s) interpose respective first and third layers such that the second conductive lines in said first insulating layer(s) are interconnected by the conductive vias to the first and second conductive lines, respectively, in the third insulating layer(s). First and second conductive lines are arranged in the third insulating layer(s) to have portions overlapping portions of the second and first conductive lines, respectively, formed in the first layer(s) so as to form an interlaced structure in which multiple capacitance surface areas are provided between the first and second plates.

The stacked first, second and third insulating layers can be substantially parallel so that the capacitance surface areas are provided between substantially parallel portions of adjacent first and second conductive lines in each of the first and third layers and between substantially parallel overlapping portions of the first and second conductive lines.

The first and second conductive lines can be formed from conductive material filled in first and second trenches, respectively, formed in the first and third insulating layers. The conductive vias can be formed as conductive material filled in trenches or holes formed in the second insulating layer(s). The conductive material used to form the first conductive lines, second conductive lines and/or vias can be metal, such as Aluminum or Copper, a metal alloy or a semiconductor. The first, second and/or third insulating layers can be formed from the same or different insulating material, such as for example, silicon dioxide, silicon nitride or a low-k insulator.

The first conductive lines and said second conductive lines can include a plurality of corners. The corners of the first and second conductive lines arranged in the first insulating layer(s) can be respectively interconnected to the corners of first and second conductive lines in the third insulating layer(s) by the conductive vias. For example, first and second conductive lines can be configured as zigzag lines staggered alternately side by side, every other one corner of the first and second conductive lines arranged in the first insulating layer(s) being interconnected to every other opposite corner of respective first and second conductive lines in the third insulating layer(s) and every other opposite corner of the first and second conductive lines in the first insulating layer(s) being interconnected to every other one corner of the next respective first and second conductive lines in the third insulating layer(s).

According to yet another aspect, a method of forming a plate to plate capacitor comprises forming a first plate, forming a second plate, forming an insulator separating the first plate from the second plate, and interlacing the first and second plates so as to provide multiple capacitance surface areas between the first and second plates.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
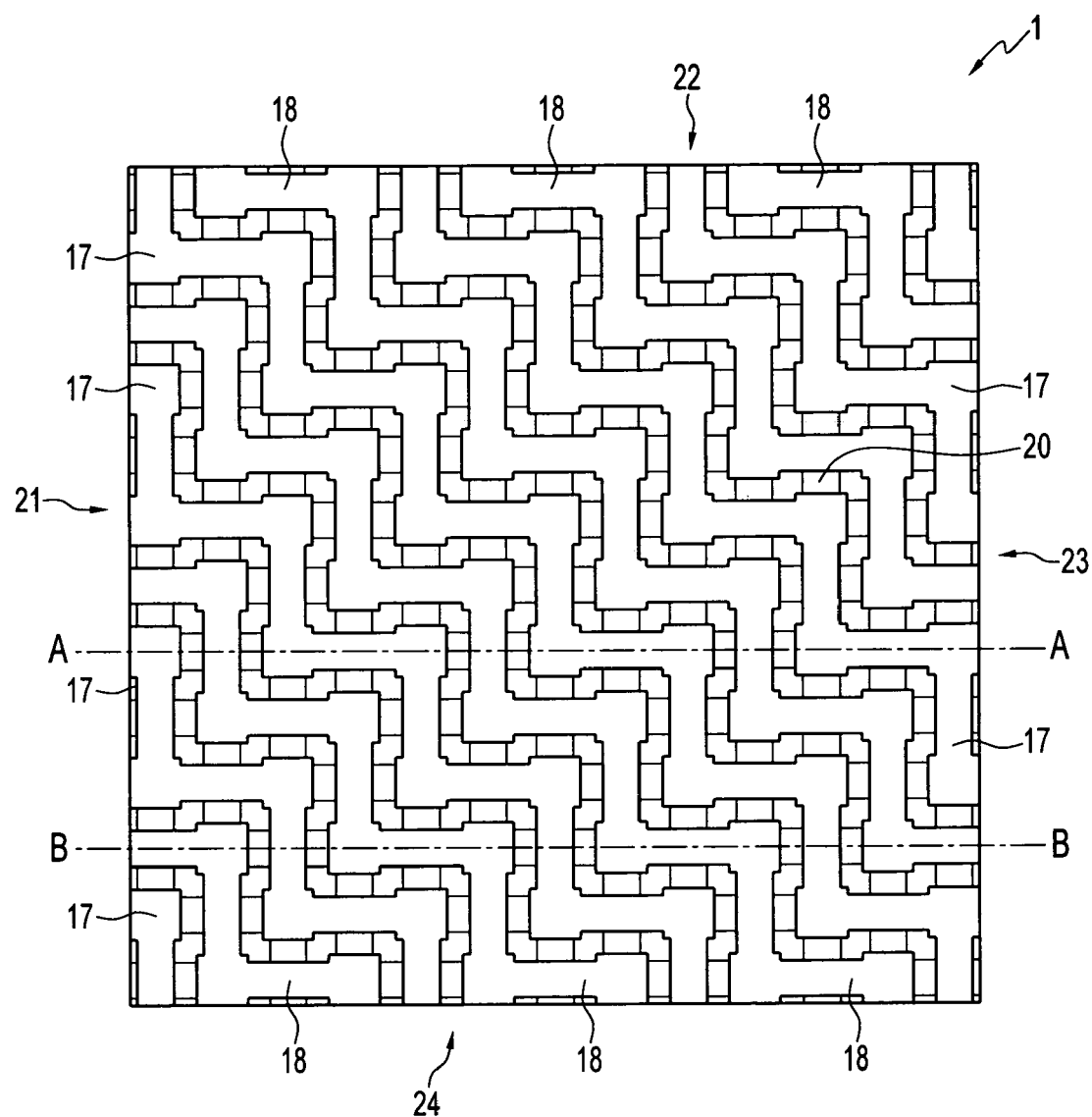
FIG. 1 illustrates a perspective view taken from above of a multi-surfaced plate-to-plate capacitor according to one embodiment.
Figure 4:
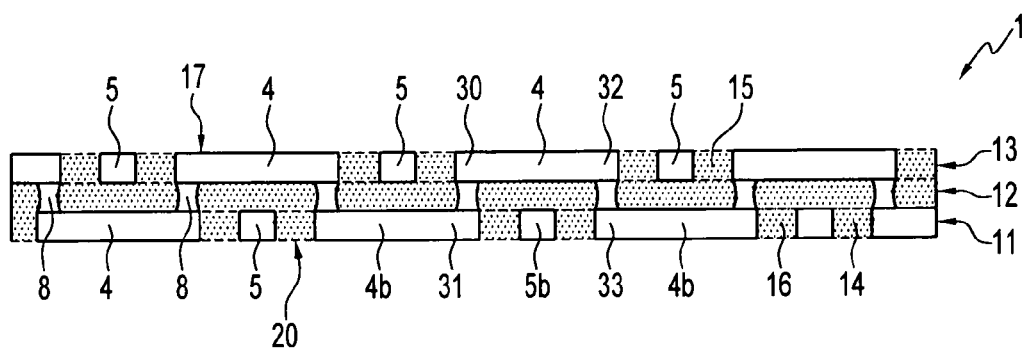
Figure 5:
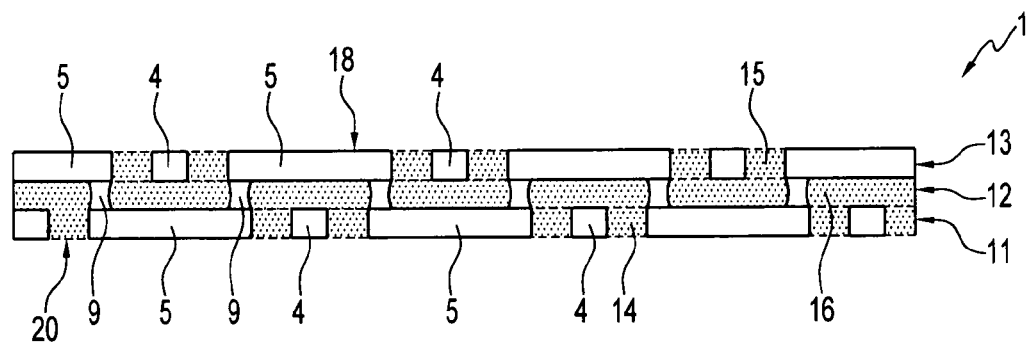

Referring to FIG. 1 of the accompanying drawings, which illustrates a plan view taken from above a multi-surfaced plate to plate capacitor according to one embodiment, a capacitor multi-surfaced plate to plate capacitor 1 has a first plate 17 and a second plate 18 which are separated by an insulating medium 20. As shown in FIGS. 4 & 5 which, respectively, illustrate cross-sectional views taken along line A-A and along line B-B of FIG. 1, the capacitor 1 is fabricated as a stack of layers 11, 12, 13 so that the capacitor can be implemented in an integrated circuit (IC). Layers 11, 12, 13 consist of insulating layers 14, 15, 16, respectively, having conductive material formed therein.

Advantageously, the first and second plates 17, 18 are formed as interconnected first conductive lines 4 and interconnected second conductive lines 5, respectively, which are interlaced so as to form a capacitor having multiple capacitance surface areas as will be explained in more detail below.

In the capacitor of the illustrative embodiments, the conductive lines 4, 5 are in the form of metal lines, such as for example, Copper (Cu) or Aluminum (Al) lines, or lines formed from other metals or metal alloys. However, the conductive lines can be formed from conductive materials other than metal such as semiconductor material. Insulators 14, 15, 16, which together form the insulating medium 20, can be respectively formed from the same or different insulator material, such as silicon dioxide, silicon nitride, low-k insulators or other suitable insulator/dielectrics or combinations thereof.

Figure 2:
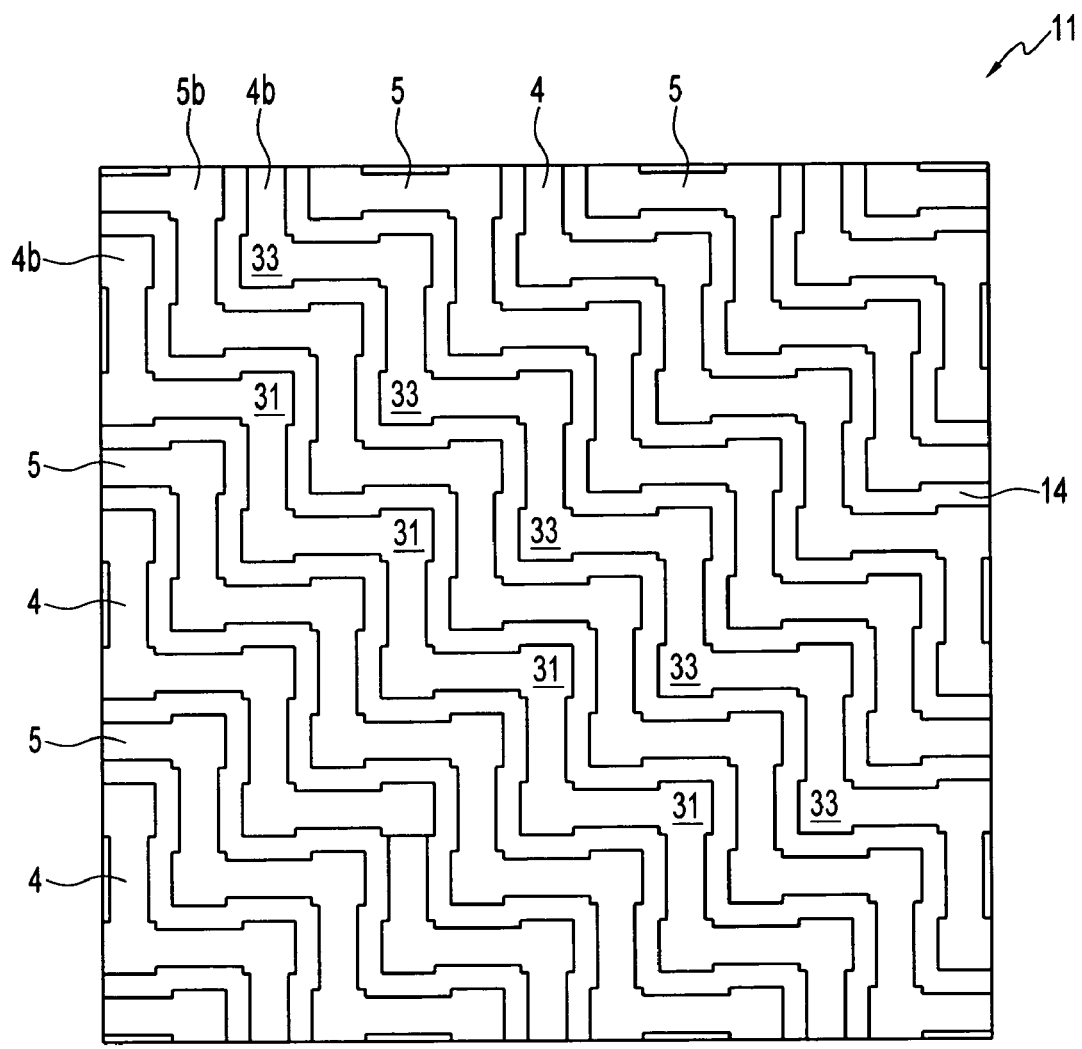
FIGS. 2 & 3 illustrate plan views taken from above lower and upper layers, respectively, of the capacitor shown in FIG. 1, FIGS. 4 & 5 illustrate cross-sectional views taken along lines A-A and B-B, respectively, shown in FIG. 1, FIGS. 6a to 6e illustrate cross-sectional views taken along line A-A shown in FIG. 1 during various stages of the manufacture of the capacitor of FIG. 1.
Figure 3:
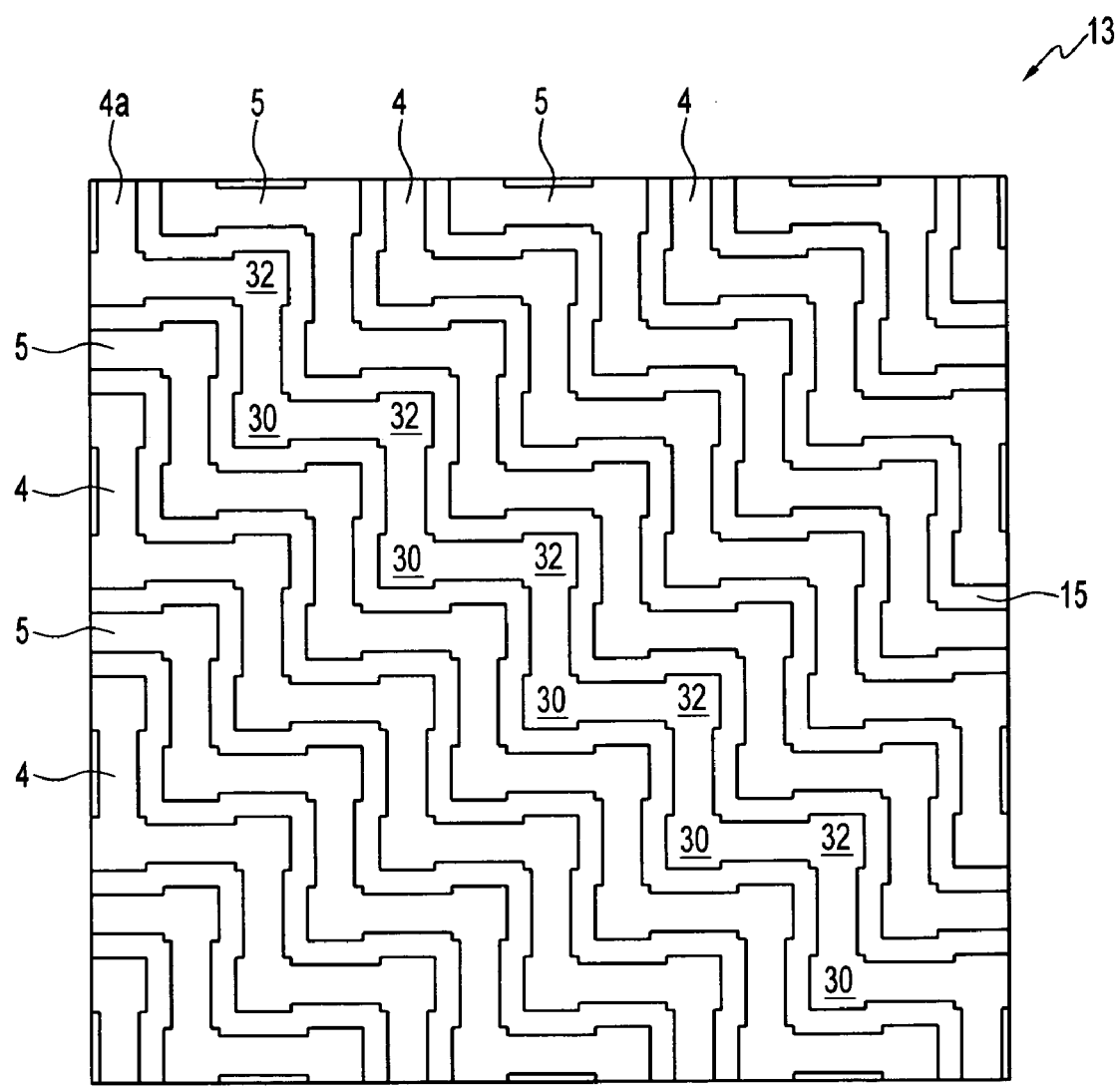

Referring additionally to FIGS. 2 & 3 which, respectively, illustrate plan views taken from above lower and upper stacked layers of the capacitor of FIG. 1, the capacitor 1 has a lower layer 11 consisting of alternating first metal lines 4 and second metal lines 5, spaced apart in the insulator 14, an upper layer 13 consisting of alternating corresponding first metal lines 4, and second metal lines 5 spaced apart in the insulator 15, and a middle layer 12, sandwiched between the lower and upper layers, consisting of vias 8,9, also formed from metal, such as aluminum or copper, or other conductive material, spaced apart in the insulator 16. The first and second metal lines 4, 5 in the upper layer 13 are arranged relative to corresponding first and second metal lines 4, 5 in the upper layer such that portions of the first and said second metal lines 4, 5 in the upper layer overlap portions of second metal lines 5 and first metal lines 4, respectively, in the lower layer.

In the illustrative embodiment, each of the lower layer metal lines 4, 5 is configured as a zigzag line staggered relative to the next metal line so that the metal lines are partially nested together forming a substantially symmetrical pattern as shown in FIG. 2. Metal lines 4, 5 of the upper layer 13 are patterned in an identical manner to the lower layer metal lines 4, 5 with the exception that the upper layer metal lines 4, 5 are laterally staggered relative to the lower layer metal lines 4, 5, by a length of one line segment as best shown by comparing FIGS. 2 & 3.

As best shown in FIG. 4, first metal lines 4 in the lower layer 11 are interconnected by means of vias 8 to the corresponding first metal lines 4 in the upper layer 13 so as to form the first plate 17 of the capacitor 1. Second metal lines 5 in the lower layer 11 are interconnected by vias 9 to corresponding metal lines 5 in the upper layer 13 so as to form the second plate 18, as best shown in FIG. 5.

Reference will now be made to FIGS. 2 to 5 for the purpose of explaining in more detail how the first metal lines 4 and second metal lines 5 are interlaced together. As can be seen by comparing FIGS. 2 and 3, in conjunction with FIG. 4, every other one corner 30 of a specific first metal line 4*a* in the upper layer 13 coincides with every other opposite corner 31 of a specific first metal line 4*b* therebelow in the lower layer 11. Alternate line segments of metal line 4*a* cross over, but do not contact, alternate line segments of a second metal line 5*b* therebelow in the lower layer 11 so that every other opposite corner 32 of the metal line 4*a* coincides with every other corner 33 of the next first metal line 4*b* therebelow. Vias 8 interconnect coincident corners 30, 31 and coincident corners 32, 33 respectively (see FIG. 4). This interconnection system is duplicated for all the first metal lines 4 in the upper and lower layers so that all the first metal lines 4 are interconnected thereby forming the single first plate 18.

Also, the second metal lines 5 are interconnected by vias 9 and cross over first metal lines 4 so to form the single second plate 18 in a manner analogous to that described above for the first metal lines 4. Advantageously, this interconnection system and metal line arrangement enables the metal lines 4 of the first plate 17 to be interlaced with metal lines 5 of the second plate 18 thereby forming a weave or mesh like structure.

As best seen from FIGS. 4 & 5, the interlaced structure provides plate to plate capacitance areas not only between horizontal parallel surfaces of overlapping first and second metal line portions, but also between opposing vertical side surfaces of adjacent first and second metal lines 4,5 in each of the lower and upper layers 11,13, respectively. The capacitor 1 therefore contains many small plate to plate capacitance surface areas that, together, form a large total known capacitance.

At a prescribed distance along the length of the metal lines 4,5 the metal lines bend or turn, going from horizontal to vertical to horizontal, and bend around each via junction in order to generate as much parallel surface area between the plates as needed. The metal lines 4, 5 are spaced apart at a distance that allows minimum technology spacing between the first and second electrodes 17, 18. The width of the metal lines 4, 5 themselves is determined by the amount of metal needed to surround via connections between lower and upper layers 2, 3. The bidirectional metal and dense pattern of the interlaced structure provides a uniform structure with a capacitance value comparable to that of other existing capacitors.

Referring to FIG. 1, metal line buses (not shown) can typically be run parallel to any one of the four vertical sides 21,22,23,24 of the capacitor 1 for connection to any one of the first metal lines 4 and any one of the second metal lines 5 at the selected side 21,22,23,24 so as to tie the plate 17, 18 to a common connecting point for hook up. The capacitor 1 therefore has the advantage of having multiple contact points to both plates 17, 18 on any one side of the capacitor. Alternatively or additionally, bus connections can be made to the plates 17, 18 from the top or bottom of the capacitor or via an adjacent layer, for example via middle layer 12. Also, if necessary, bus connections can be made to the plates 17, 18 in different layers 11, 13 and/or from different locations. Consequently, bus connections to capacitor 1 can customized to suit other circuitry requirements more easily than existing capacitors with fixed hook up points thereby facilitating easier routing between the capacitor and other circuits. Furthermore, since the bus connections can, if required, be made to both plates 17, 18 on the same side of the capacitor 1, the substrate area required for making the bus connections can be reduced compared to existing capacitors which require additional substrate area for running bus connections to electrodes on different sides of the capacitors. For these reasons, the capacitor 1 can therefore be integrated into existing integrated circuits more easily and effectively than existing capacitors.

One example of a method of manufacturing the plate to plate capacitor 1 of the illustrative embodiment shown in FIG. 1 will now be described with reference to FIGS. 6*a* to 6*e*, which respectively, illustrate cross-sectional views taken along line A-A of FIG. 1 at various stages of manufacture.

Figure 6A:
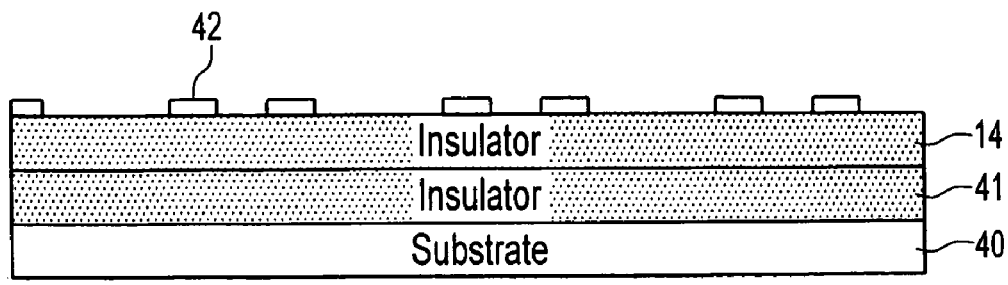

The method according to this particular embodiment is implemented using a dual damascene process as is known in the art. Initially, an insulator layer 41, such as $SiO_2$, and another insulator layer 14, such as a low-K insulator, can be sequentially formed on a substrate 40 as shown in FIG. 6*a*. In this particular embodiment, the substrate 40 is silicon which cannot act as sufficient insulator as compared to $SiO_2$ or low-K insulators and which can become conductive and/or act as a parasitic thereby lowering the performance of the capacitor. With this in mind, an isolating insulator layer 41 is provided preparatory to fabricating the capacitor 1 so as to provide adequate separation between the silicon substrate and the lower layer 11 of the capacitor 1. However, if the substrate is an insulator, particularly a low-K insulator, no additional insulator layer 41 is required.

Figure 6B:
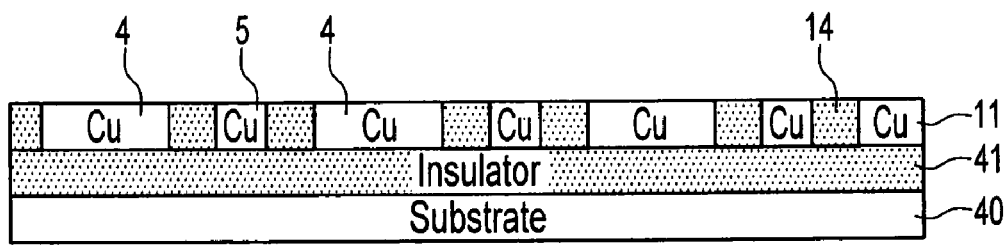
Figure 6C:
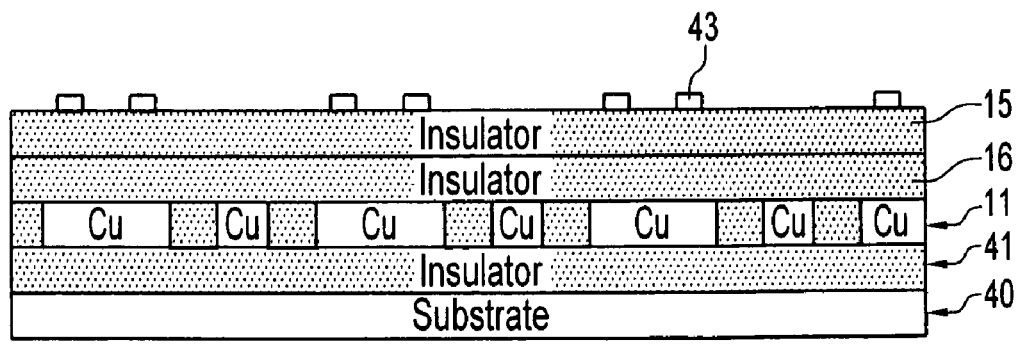

A first mask or photo resist 42 is applied to insulator layer 11 for patterning trenches in the insulator layer 14. The trenches are then etched, for example by reactive ion etching, and the photo resist removed. A first metal is deposited on the structure to fill the trenches with the first metal, in this case copper (Cu), so as to form metal lines 4, 5 in the insulator 14, thereby defining lower layer 11 of the capacitor, as shown in FIG. 6*b*.

Figure 6D:
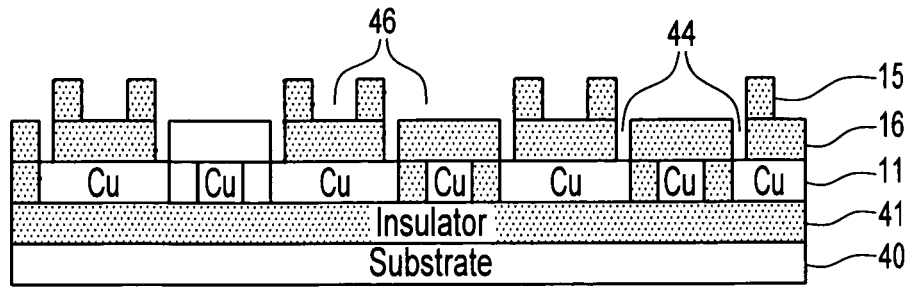
Figure 6E:
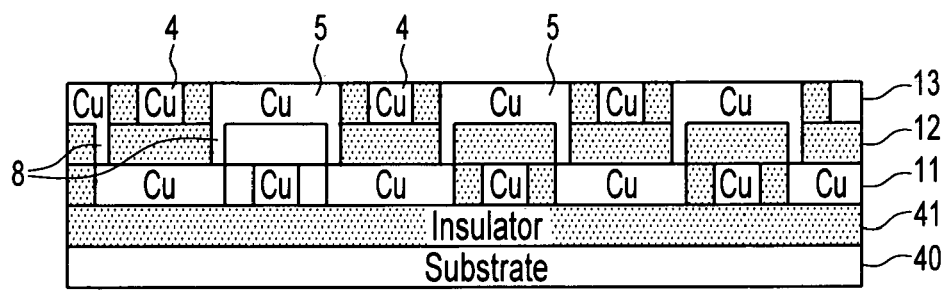

The lower layer 11 is then covered with a double insulator layer 16, 15 and a second mask or photo resist 43 is applied thereon to pattern trenches 46 in the uppermost insulator layer 15. Preparatory to filling the trenches 46, a third mask or photo resist 45 is applied to the insulator layer 15 to pattern trenches 44 in insulator layer 16 only. Trenches 44 are then etched or drilled in the insulator 16 and the photo resist removed as shown in FIG. 6d. Trenches 44 and 46 are filled with a second metal, in this case also Cu, by depositing the second metal on the structure, as shown in FIG. 6e as to form the vias 8 and metal lines 6, 7 thereby defining middle layer 12 and upper layer 13 of the capacitor 1.

Existing methods of patterning metal lines and vias in insulating layers can be utilized in the method of manufacturing the capacitor 1 of the illustrative embodiment so that no further layers or mask sets need to be defined for the purpose of manufacturing the capacitor 1. For example, those skilled in the art would understand that the metal lines and vias could be patterned in the insulating layers using alternative methods to reactive ion etching, such as for example wet chemical etching, and using processes other than dual damascene. The first and second metals and insulating layers can be deposited by various known means, such as for example plasma enhanced chemical vapor deposition or physical vapor deposition.

Figure 7:
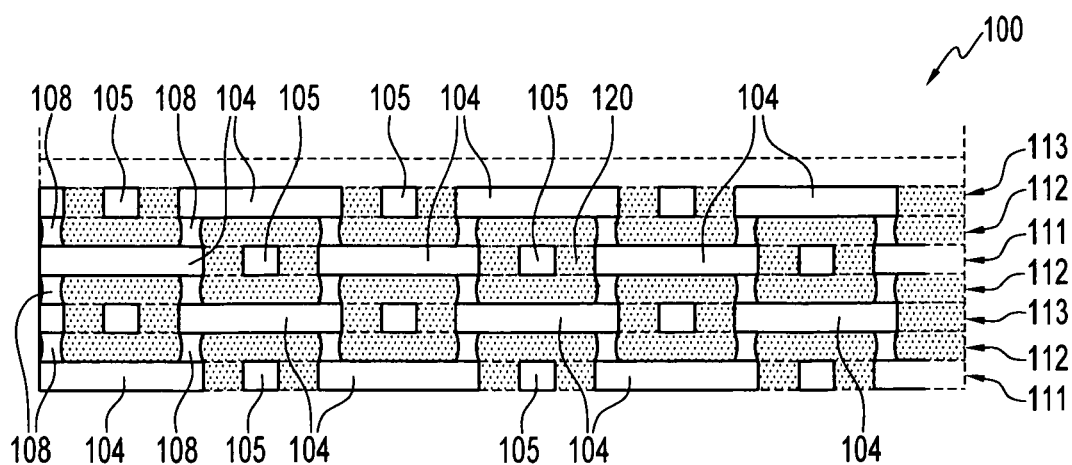
FIG. 7 illustrates a partial cross-sectional view of a multi-surfaced capacitor according to another embodiment.

Referring now to FIG. 7 which, illustrates partial cross-sectional view of multiple stacked layers of a capacitor 100 according to another embodiment, the capacitor 100 has first layers 111, second layers 112, and a third layers 113, which are respectively identical to lower, middle and upper layers 11, 12, 13 of the capacitor 1 of the first embodiment (see particularly FIG. 4 for comparison). Metal lines 104 105 of first layers 111 are therefore identical and arranged in an identical manner to metal lines 4, 5 of lower layer 111 shown in FIG. 2, metal vias 108 of second layers 112 are identical and arranged in an identical manner to vias 8 of the middle layer 12 (see FIG. 4), and metal lines 104,105 of third layers 113 are therefore identical and arranged in a similar manner to metal lines 4, 5 of upper layer 113 shown in FIG. 3. Furthermore, insulating medium 120 corresponds to insulating medium 20 of capacitor 1.

As shown in FIG. 7, the capacitor of FIG. 7 differs from the capacitor of FIG. 1 in that additional first layers 111 and third layers 113 are alternately stacked on the capacitor with respective second layers 112 therebetween so as to mirror the structure of the capacitor 1. Accordingly, the metal lines 104,105 of the additional first stacked layers 111 are interconnected to corresponding metal lines 104,105 adjacent third layers 113 by means of the vias of respective second layers 112. The uppermost layer of the capacitor 100 can be either a first or third metal layer 111,113, as required.

Bus connections can be made to the capacitor plates, that is, interconnected metal lines 104,105, in the same way that bus connections can be made to the capacitor plates of the capacitor 1 of the first embodiment.

The number of metal layers 112, 113 employed in a particular capacitor 100 will depend on desired capacitance density. Advantageously, the capacitance density of the capacitor 100 can be increased or decreased, by increasing or decreasing the number of the first and second layers 112, 113 employed in the capacitor, without changing the substrate surface area needed to accommodate the capacitor. The more stacked layers 111,112, 113 present, the higher the total capacitance per area of chip surface. The capacitor 100 can therefore be integrated more easily into existing integrated circuits because the capacitance density of the capacitor can be increased without requiring more substrate surface area to accommodate the capacitor.

Those skilled in the art would understand that the accompanying figures are merely depicting examples of the embodiments and that the embodiments are not limited thereto. For example, the metal lines 4, 5 of the capacitor 1 shown in FIG. 1 could be configured in a serpentine pattern having curved corners rather than the angular corners shown. Furthermore, the metal line patterns need not be substantially symmetrical nor is it necessary that the metal lines 4,5 of alternate layers extend in respective substantially parallel planes or that the metal line corners have an angle of substantially 90 degrees as shown in the accompanying Figures. Also, those skilled in the art would understand that the capacitor could be formed by using metal lines without corners by interconnecting the ends of separated metal lines (or line segments) in one plane to ends of corresponding metal lines in the next plane. The first and second metal lines in each plane need only be arranged such that portions of the first and second metal lines in one plane overlap portions of the second and first metal lines, respectively, in the next plane so that capacitance surface area is generated between overlapping portions of the first and second metal lines and between adjacent portions of the first and second metal lines in the same plane.

Additionally, those skilled in the art would under stand that the multi plate to plate capacitor need not be implemented as a layered structure as shown in the illustrative embodiment for the purpose of circuit integration and could alternatively be implemented in other forms. For example, the metal lines could be in the form of metal wires embedded in a unitary insulator and the metal wires could be weaved or interlaced together.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

What is claimed is:

1. A plate to plate capacitor comprising
a first plate,
a second plate, and
an insulating medium separating said first plate from said second plate,
wherein said first plate comprises a plurality of interconnected first conductive lines and wherein said second plate comprises a plurality of interconnected second conductive lines, wherein said first and second conductive lines extend in at least one first plane and in at least one second plane; and
wherein said first and second conductive lines in said first plane(s) overlap portions of the corresponding second conductive lines and first conductive lines, respectively, in said second plane(s) so as to form an interlaced structure in which multiple capacitance surface areas are provided between said first and second plates.

2. The capacitor of claim 1, wherein said capacitor comprises a thin film capacitor.

3. The capacitor of claim 1, wherein said first conductive lines and said second conductive lines are configured next to one another extending in said first plane(s) and in said second plane(s) substantially parallel to said first plane(s), said first and second conductive lines in said first plane(s) being interconnected to said first and second conductive lines, respectively, in said second plane(s) by conductive links and capacitance surface areas being provided between substantially parallel portions of adjacent first and second conductive lines in each of the first and second planes and being provided between substantially parallel overlapping portions of said first and second conductive lines.

4. The capacitor of claim 3, wherein said first and second conductive lines configured in said at least one first plane comprise conductive material patterned or formed in at least one first insulating layer, wherein said conductive links comprise conductive material patterned or formed in at least one second insulating layer, and wherein said first and second conductive lines configured in said at least one second plane comprise conductive material patterned or formed in at least one third insulating layer, said second insulating layer(s) interposing respective first and third layers.

5. The capacitor of claim 4, wherein said first conductive lines and said second conductive lines include a plurality of corners, the corners of said first and second conductive lines configured in said first insulating layer(s) being respectively interconnected to the corners of said first and second conductive lines configured in said third insulating layer(s) by said conductive links configured in said second layer(s).

6. The capacitor of claim 5, wherein said first and second conductive lines are configured as zigzag lines staggered alternately side by side, said first and second conductive lines in said third insulating layer(s) being staggered relative to said first and second conductive lines in said first insulating layer(s) such that every other one corner of the first conductive lines arranged in said first layer(s) are interconnected to every other opposite corner of respective first conductive lines in said third layer(s) and every other opposite corner of said first conductive lines in said first layer(s) are interconnected to every other one corner of the next first conductive lines in said third layer(s).

7. A plate to plate capacitor comprising plurality of first and second conductive lines;
a stack of first, second and third insulating layers, said second insulating layer interposing said first and third insulating layers;
wherein said first and second conductive lines are formed spaced apart in each of said first and third insulating layers;
wherein said first and second conductive lines in said first insulating layer overlap portions of the corresponding second conductive lines and first conductive lines, respectively, in said third insulating layer; and
wherein said first and second conductive lines in said first insulating layer interconnect through said second insulating layer said first and second conductive lines, respectively, in said third insulating layer, thereby forming said first and second capacitor plates, respectively interlaced to provide multiple capacitance surface areas between said first and second plates.

8. The plate to plate capacitor of claim 7, further comprising
first insulating layers and least one third insulating layers alternately stacked together,
second insulating layer having a plurality of conductive vias formed spaced apart therein, said second layers interposing respective first and third insulating layers,
wherein said first and second conductive lines are formed spaced apart in each of said first and third insulating layers, and
wherein said first and second conductive lines in said first insulating layers are interconnected by said conductive vias to said first and second conductive lines, respectively, in said third insulating layers thereby forming said first and second capacitor plates, respectively.

9. The capacitor of claim 8, wherein said stacked first, second and third insulating layers are substantially parallel and wherein said first and second conductive lines in said first are arranged relative to said first and second conductive lines such that portions of said first and second conductive lines in said third layer cross portions of said second and first conductive lines, respectively, in said first layer, said capacitance surface areas being provided between substantially parallel portions of adjacent first and second conductive lines in each of the first and third layers and being provided between substantially parallel overlapping portions of said first and second conductive lines.

10. The capacitor of claim 8, wherein said first and second conductive lines comprise conductive material filled in first and second trenches, respectively, formed in said first and third insulating layers, and wherein said conductive vias comprise conductive material filled in trenches or holes formed in said second insulating layer.

11. The capacitor of claim 10, wherein said conductive material in said first, second, and/or third insulating layers comprises a metal, metal alloy or a semiconductor.

12. The capacitor of claim 10, wherein said first, second, and/or third insulating layers comprises silicon dioxide, silicon nitride or a low-k insulator.

13. The capacitor of claim 8, wherein said first conductive lines and said second conductive lines include a plurality of corners, the corners of said first and second conductive lines arranged in said first insulating layer being respectively interconnected to the corners of said first and second conductive lines in said third insulating layer by said conductive vias.

14. The capacitor of claim 13, wherein said first and second conductive lines are configured as zigzag lines staggered alternately side by side, every other one corner of the first and second conductive lines arranged in said first insulating layer being interconnected to every other opposite corner of respective first and second conductive lines in said third insulating layer and every other opposite corner of said first and second conductive lines in said first insulating layer being interconnected to every other one corner of the next respective first and second conductive lines in said third insulating layer.

15. A method of forming a plate to plate capacitor comprising
interconnecting a plurality of first conductive lines to form a first plate,
interconnecting a plurality of second conductive lines to form a second plate,
forming an insulator separating said first plate from said second plate,
overlapping portions of said first and second conductive lines in a first plane with corresponding said first and second conductive lines, respectivtly, in a second plane to thereby interlac said first and second plates and provide multiple capacitance surface areas between said first and second plates.

16. The method of claim 15, further comprising
providing a substrate,
forming at least one first insulating layer,
forming at least one second insulating layer,
forming at least one third insulating layer, said first and second insulating layers being alternately stacked on said substrate and said second insulating layer interposing respective first and second insulating layers,
forming said first and second conductive lines in said first insulating layer,
forming conductive vias in said second insulating layer,
forming corresponding first and second conductive lines in said third insulating layer, said conductive vias in said second layer interconnecting first and second conductive lines formed in adjacent said first insulating layer and said corresponding first and second conductive lines in said third insulating layer having portions crossing portions of said second and first conductive lines, respectively, formed in adjacent said first insulating layer.

17. The method of claim 16, further comprising
forming an isolating insulating layer on said substrate, said isolating layer interposing said substrate and said stack of first, second and third insulating layers.

18. The method of claim 16, wherein forming said first and second conductive lines in the or each said first insulating layer comprises
forming first and second trenches in said first insulating layer, and filling said first and second trenches in said first insulating layer with conductive material,
wherein forming said conductive vias in the or each said second insulating layer comprises
forming trenches or holes in said second insulating layer, and filling said trenches or holes formed in said second insulating layer with conductive material, and
wherein forming said corresponding first and second conductive lines the in said third insulating layer comprises
forming first and second trenches in said third insulating layer, and filling said first and second trenches in said third insulating layer with conductive material.

* * * * *